US007078147B2

(12) United States Patent
Harada et al.

(10) Patent No.: US 7,078,147 B2
(45) Date of Patent: Jul. 18, 2006

(54) POLYMERS, RESIST COMPOSITIONS AND PATTERNING PROCESS

(75) Inventors: Yuji Harada, Niigata-ken (JP); Jun Hatakeyama, Niigata-ken (JP); Masaru Sasago, Hirakata (JP); Masayuki Endo, Kishiwada (JP); Shinji Kishimura, Itami (JP)

(73) Assignees: Shin-Etsu Chemical Co., Ltd., Tokyo (JP); Matsushita Electric Industrial Co., Ltd, Osaka (JP)

( * ) Notice: Subject to any disclaimer, the term of this patent is extended or adjusted under 35 U.S.C. 154(b) by 0 days.

(21) Appl. No.: 10/396,556

(22) Filed: Mar. 26, 2003

(65) Prior Publication Data

US 2003/0215740 A1  Nov. 20, 2003

(30) Foreign Application Priority Data

Mar. 26, 2002 (JP) ............................. 2002-085547
Mar. 26, 2002 (JP) ............................. 2002-085598

(51) Int. Cl.
*G03F 7/038* (2006.01)
*G03F 7/039* (2006.01)
*G03F 7/30* (2006.01)
*C08F 10/00* (2006.01)
*C08F 12/30* (2006.01)

(52) U.S. Cl. ............... 430/270.1; 430/320; 430/322; 430/325; 430/326; 430/327; 430/905; 430/910; 430/914; 526/243; 526/281; 526/282; 526/286; 526/287

(58) Field of Classification Search ............. 430/270.1, 430/320, 322, 325, 326, 327, 905, 907, 910, 430/914; 526/243, 281, 282, 287, 286; 585/20

See application file for complete search history.

(56) References Cited

U.S. PATENT DOCUMENTS

| 2,163,180 | A | * | 6/1939 | Hanns | 568/28 |
| 2,472,672 | A | * | 6/1949 | Mighton | 526/229 |
| 2,538,100 | A | * | 1/1951 | Irany et al. | 526/214 |
| 2,843,570 | A | * | 7/1958 | Coover, Jr. et al. | 526/286 |
| 3,235,535 | A | * | 2/1966 | Horn | 526/240 |
| 4,161,407 | A | * | 7/1979 | Campbell | 430/621 |
| 4,491,628 | A | | 1/1985 | Ito et al. | |
| 5,310,619 | A | | 5/1994 | Crivello et al. | |
| 6,559,198 | B1 | * | 5/2003 | Novicky | 523/106 |
| 6,872,514 | B1 | * | 3/2005 | Harada et al. | 430/326 |
| 6,916,592 | B1 | * | 7/2005 | Harada et al. | 430/270.1 |
| 2003/0215739 | A1 | * | 11/2003 | Harada et al. | 430/270.1 |
| 2003/0219678 | A1 | * | 11/2003 | Harada et al. | 430/270.1 |

FOREIGN PATENT DOCUMENTS

| JP | 63-27829 A | 2/1988 |
| JP | 2-27660 B2 | 6/1990 |
| JP | 9-73173 A | 3/1997 |
| JP | 9-230595 A | 9/1997 |
| JP | 10-10739 A | 1/1998 |
| WO | 97-33198 A1 | 9/1997 |

* cited by examiner

*Primary Examiner*—Richard L. Schilling
(74) *Attorney, Agent, or Firm*—Birch Stewart Kolasch & Birch LLP

(57) ABSTRACT

A resist composition comprising a base polymer having sulfone or sulfonate units introduced therein is sensitive to high-energy radiation below 300 nm, is endowed with excellent adherence to substrates while maintaining transparency, and is suited for lithographic microprocessing.

14 Claims, No Drawings

POLYMERS, RESIST COMPOSITIONS AND PATTERNING PROCESS

This invention relates to polymers useful as the base resin in resist compositions suited for microfabrication. It also relates to resist compositions, especially chemical amplification resist compositions comprising the polymers, and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. To the demand for a resist material with a higher resolution and sensitivity, chemical amplification positive working resist materials which are catalyzed by acids generated upon light exposure are effective as disclosed in U.S. Pat. No. 4,491,628 and U.S. Pat. No. 5,310,619 (JP-B 2-27660 and JP-A 63-27829). They now become predominant resist materials especially adapted for deep UV lithography.

Also, the change-over from i-line (365 nm) to shorter wavelength KrF laser (248 nm) brought about a significant innovation. Resist materials adapted for KrF excimer lasers enjoyed early use on the 0.30 micron process, passed through the 0.25 micron rule, and currently entered the mass production phase on the 0.18 micron rule. Engineers have started investigation on the 0.10 micron rule or less, with the trend toward a finer pattern rule being accelerated.

For ArF laser (193 nm), it is expected to enable miniaturization of the design rule to 0.13 μm or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

SUMMARY OF THE INVENTION

An object of the invention is to provide a novel polymer having a high transmittance to a laser beam of up to 300 nm, especially KrF (248 nm), ArF (193 nm), $F_2$ (157 nm), $Kr_2$ (146 nm), KrAr (134 nm) and $Ar_2$ (126 nm) excimer laser beams, and useful as the base resin in a resist composition. Another object is to provide a resist composition, and especially a chemical amplification resist composition, comprising the polymer, and a patterning process using the same.

It has been found that when a polymer having sulfone or sulfonate units introduced therein is used as a base resin, the resulting resist composition, especially chemically amplified resist composition is drastically improved in substrate adhesion without detracting from transparency.

In a first aspect, the present invention provides a polymer. One embodiment provides a polymer comprising recurring units of the following general formula (1) and having a weight average molecular weight of 1,000 to 500,000.

Herein $R^1$ to $R^3$ each are hydrogen, fluorine or a straight, branched or cyclic alkyl or fluorinated alkyl group of 1 to 20 carbon atoms, $R^4$ is a valence bond or a straight, branched or cyclic alkylene or fluorinated alkylene group of 1 to 20 carbon atoms, and $R^5$ is a straight, branched or cyclic alkyl group of 1 to 20 carbon atoms which may contain a hetero atom.

Another embodiment provides a polymer comprising recurring units of the following general formula (2a) or (2b) and having a weight average molecular weight of 1,000 to 500,000.

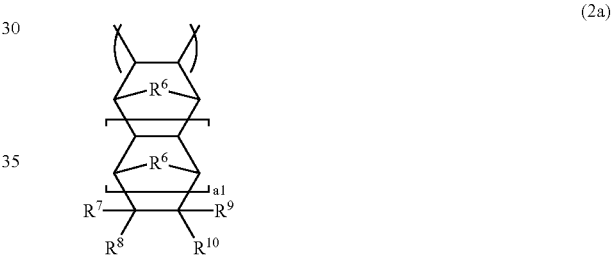

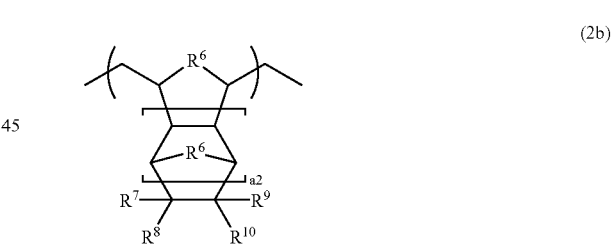

Herein $R^6$ is a methylene group, oxygen atom, sulfur atom or $SO_2$, $R^7$ to $R^{10}$ each are hydrogen, fluorine, a straight, branched or cyclic alkyl or fluorinated alkyl group of 1 to 20 carbon atoms or $-R^{11}-SO_2R^{12}$, at least one of $R^7$ to $R^{10}$ containing $-R^{11}-SO_2R^{12}$, $R^{11}$ is a valence bond or a straight, branched or cyclic alkylene or fluorinated alkylene group of 1 to 20 carbon atoms, $R^{12}$ is fluorine or a straight, branched or cyclic alkyl group of 1 to 20 carbon atoms which may contain a hetero atom, a1 is 0 or 1, and a2 is an integer of 0 to 2.

A further embodiment provides a polymer comprising recurring units each having a functional group of the following general formula (3), and having a weight average molecular weight of 1,000 to 500,000.

(3)

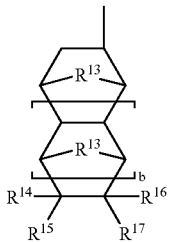

Herein $R^{13}$ is a methylene group, oxygen atom, sulfur atom or $SO_2$, $R^{14}$ to $R^{17}$ each are hydrogen, a straight, branched or cyclic alkyl group of 1 to 20 carbon atoms, $-R^{18}-SO_3R^{19}$ or $-R^{18}-SO_2R^{19}$, at least one of $R^{14}$ to $R^{17}$ containing $-R^{18}-SO_3R^{19}$ or $-R^{18}-SO_2R^{19}$, $R^{18}$ is a valence bond or a straight, branched or cyclic alkylene group of 1 to 20 carbon atoms, $R^{19}$ is hydrogen, an acid labile group, an adhesive group or a straight, branched or cyclic alkyl group of 1 to 20 carbon atoms, and b is 0 or 1.

Preferably, the polymer includes recurring units of any one of the following general formulae (4-1) to (4-5).

(4-1)

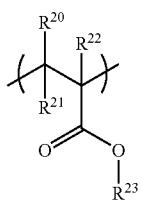

(4-2)

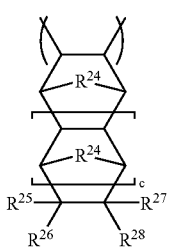

(4-3)

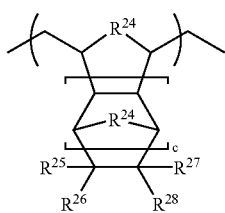

(4-4)

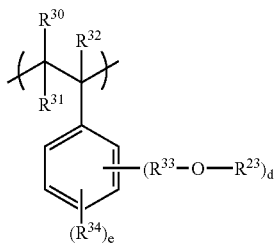

(4-5)

Herein $R^{20}$ to $R^{22}$ and $R^{30}$ to $R^{32}$ each are hydrogen, fluorine or a straight, branched or cyclic alkyl or fluorinated alkyl group of 1 to 20 carbon atoms, $R^{23}$ is a group of the above formula (3), hydrogen, an acid labile group, an adhesive group, or a straight, branched or cyclic alkyl or fluorinated alkyl group of 1 to 20 carbon atoms, $R^{24}$ is a methylene group, oxygen atom, sulfur atom or $SO_2$, $R^{25}$ to $R^{28}$ each are hydrogen, fluorine, $-R^{29}-OR^{23}$, $-R^{29}-CO_2R^{23}$ or a straight, branched or cyclic alkyl or fluorinated alkyl group of 1 to 20 carbon atoms, $R^{29}$ and $R^{33}$ each are a valence bond or a straight, branched or cyclic alkylene or fluorinated alkylene group of 1 to 20 carbon atoms, $R^{34}$ is a straight, branched or cyclic fluorinated alkyl group of 1 to 20 carbon atoms, c is 0 or 1, d is 1 or 2, e is an integer of 0 to 4, and $1 \leq d+e \leq 5$.

In a second aspect, the present invention provides a resist composition comprising the polymer defined above, preferably a chemically amplified positive resist composition comprising (A) the polymer defined above, (B) an organic solvent, and (C) a photoacid generator. The resist composition may further include (D) a basic compound and/or (E) a dissolution inhibitor.

In a third aspect, the present invention provides a process for forming a resist pattern comprising the steps of applying the resist composition onto a substrate to form a coating; heat treating the coating and then exposing it to high-energy radiation in a wavelength band of 100 to 300 nm or 1 to 30 nm through a photomask; and optionally heat treating the exposed coating and developing it with a developer. The high-energy radiation used herein is typically a KrF, ArF, $F_2$ or $Ar_2$ laser beam or soft x-ray.

DESCRIPTION OF THE PREFERRED EMBODIMENTS

Polymer

The inventor has found that sulfones or sulfonates, despite the inclusion of two sulfur-to-oxygen double bonds, have a high transmittance at wavelengths near 248 nm, 193 nm and 157 nm, and that resins comprising such units are drastically improved in substrate adhesion and developer penetration over conventional commonly used polymers. It has been found that by introducing units of the general formula (1), (2a), (2b) or (4-1) to (4-5), shown below, or units having substituent groups of the general formula (3), shown below, into a polymer for use as a base resin in resist compositions, the polymer is drastically improved in transparency while minimizing a decline of resin's adhesion to substrates and the repellency of the resin to developers.

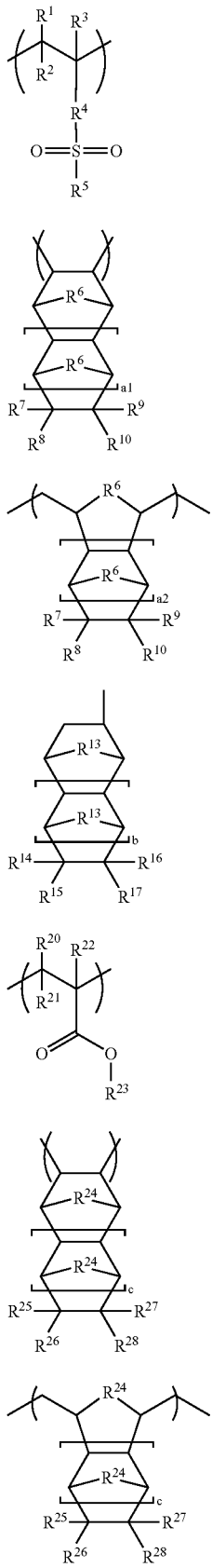

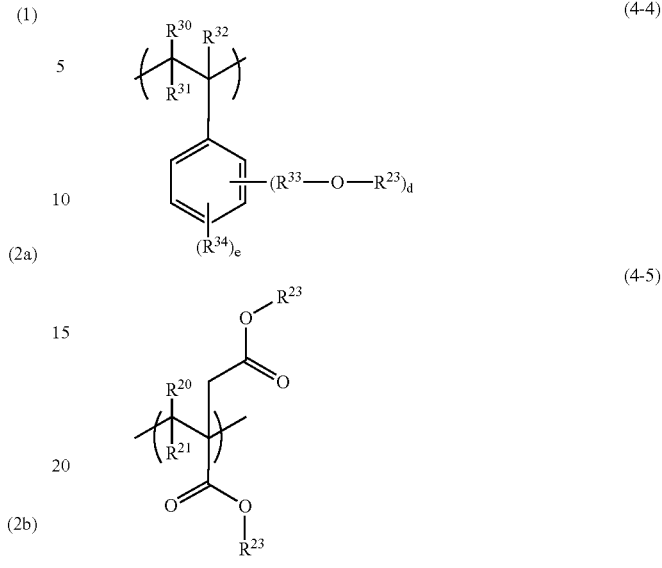

In the formulae, $R^1$ to $R^3$ each are a hydrogen atom, a fluorine atom or a straight, branched or cyclic alkyl or fluorinated alkyl group of 1 to 20 carbon atoms. $R^4$ is a valence bond or a straight, branched or cyclic alkylene or fluorinated alkylene group of 1 to 20 carbon atoms. $R^5$ is a straight, branched or cyclic alkyl group of 1 to 20 carbon atoms which may contain a hetero atom.

$R^6$ is a methylene group, oxygen atom, sulfur atom or $SO_2$. $R^7$ to $R^{10}$ each are a hydrogen atom, a fluorine atom, a straight, branched or cyclic alkyl or fluorinated alkyl group of 1 to 20 carbon atoms or $-R^{11}-SO_2R^{12}$. At least one of $R^7$ to $R^{10}$ should contain $-R^{11}-SO_2R^{12}$. $R^{11}$ is a valence bond or a straight, branched or cyclic alkylene or fluorinated alkylene group of 1 to 20 carbon atoms. $R^{12}$ is a fluorine atom or a straight, branched or cyclic alkyl group of 1 to 20 carbon atoms which may contain a hetero atom.

$R^{13}$ is a methylene group, oxygen atom, sulfur atom or $SO_2$. $R^{14}$ to $R^{17}$ each are a hydrogen atom, a straight, branched or cyclic alkyl group of 1 to 20 carbon atoms, $-R^{18}-SO_3R^{19}$ or $-R^{18}-SO_2R^{19}$. At least one of $R^{14}$ to $R^{17}$ should contain $-R^{18}-SO_3R^{19}$ or $-R^{18}-SO_2R^{19}$. $R^{18}$ is a valence bond or a straight, branched or cyclic alkylene group of 1 to 20 carbon atoms. $R^{19}$ is a hydrogen atom, an acid labile group, an adhesive group or a straight, branched or cyclic alkyl group of 1 to 20 carbon atoms.

$R^{20}$ to $R^{22}$ and $R^{30}$ to $R^{32}$ each are a hydrogen atom, fluorine atom or a straight, branched or cyclic alkyl or fluorinated alkyl group of 1 to 20 carbon atoms. $R^{23}$ is a group of the above formula (3), a hydrogen atom, an acid labile group, an adhesive group, or a straight, branched or cyclic alkyl or fluorinated alkyl group of 1 to 20 carbon atoms. $R^{24}$ is a methylene group, oxygen atom, sulfur atom or $SO_2$. $R^{25}$ to $R^{28}$ each are a hydrogen atom, fluorine atom, $-R^{29}-OR^{23}$, $-R^{29}-CO_2R^{23}$ or a straight, branched or cyclic alkyl or fluorinated alkyl group of 1 to 20 carbon atoms. $R^{29}$ and $R^{33}$ each are a valence bond or a straight, branched or cyclic alkylene or fluorinated alkylene group of 1 to 20 carbon atoms. $R^{34}$ is a straight, branched or cyclic fluorinated alkyl group of 1 to 20 carbon atoms.

The subscript a1 is 0 or 1, a2 is an integer of 0 to 2, b is 0 or 1, c is 0 or 1, d is 1 or 2, and e is an integer of 0 to 4, and $1 \leq d+e \leq 5$.

More particularly, suitable straight, branched or cyclic alkyl groups have 1 to 20 carbon atoms, preferably 1 to 12 carbon atoms, more preferably 1 to 10 carbon atoms. Examples include, but are not limited to, methyl, ethyl, propyl, isopropyl, n-propyl, n-butyl, sec-butyl, tert-butyl, cyclopentyl, cyclohexyl, cyclohexylmethyl, 2-ethylhexyl, n-octyl, 1-adamantyl, 2-adamantyl, and (2-adamantyl)methyl.

The fluorinated alkyl groups correspond to the foregoing alkyl groups in which some or all of the hydrogen atoms are replaced by fluorine atoms. Examples include, but are not limited to, trifluoromethyl, 2,2,2-trifluoroethyl, 3,3,3-trifluoropropyl, 1,1,1,3,3,3-hexafluoroisopropyl, and 1,1,2,2,3,3,3-heptafluoropropyl.

Suitable straight, branched or cyclic alkylene groups of 1 to 20 carbon atoms correspond to the foregoing alkyl groups with one hydrogen atom eliminated. Suitable fluorinated alkylene groups are similar alkylene groups which are partially or entirely substituted with fluorine atoms.

The acid labile group represented by $R^{23}$ is selected from a variety of such groups, preferably from among the groups of the following formulae (5) to (7).

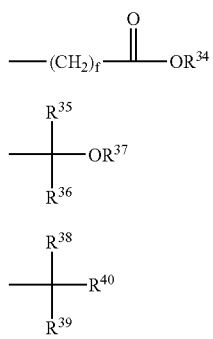

(5)

(6)

(7)

In formula (5), $R^{34}$ is a tertiary alkyl group of 4 to 20 carbon atoms, preferably 4 to 15 carbon atoms, an oxoalkyl group of 4 to 20 carbon atoms or a group of formula (5). Suitable tertiary alkyl groups include tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Suitable oxoalkyl groups include 3-oxocyclohexyl, 4-methyl-2-oxooxan-4-yl, and 5-methyl-5-oxooxolan-4-yl. Letter f is an integer of 0 to 6.

Illustrative, non-limiting, examples of the acid labile group of formula (5) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxy-carbonyl, 1-ethylcyclopentyloxycarbonylmethyl, 1-ethyl-2-cyclopentenyloxycarbonyl, 1-ethyl-2-cyclo-pentenyloxycarbonylmethyl, 1-ethoxyethoxycarbonylmethyl, 2-tetrahydropyranyloxycarbonylmethyl, and 2-tetrahydrofuranyloxycarbonylmethyl groups.

In formula (6), $R^{35}$ and $R^{36}$ are hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^{37}$ is a monovalent hydrocarbon group of 1 to 18 carbon atoms, preferably 1 to 10 carbon atoms, which may contain a hetero atom such as oxygen, for example, straight, branched or cyclic alkyl groups and substituted ones of these alkyl groups in which some hydrogen atoms are substituted with hydroxyl, alkoxy, oxo, amino or alkylamino groups. Exemplary substituted alkyl groups are shown below.

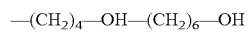

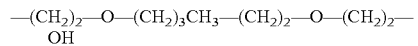

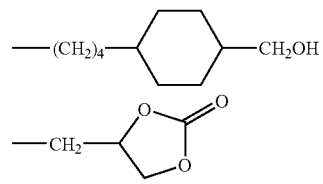

A pair of $R^{35}$ and $R^{36}$, a pair of $R^{35}$ and $R^{37}$, or a pair of $R^{36}$ and $R^{37}$ may bond together to form a ring. Each of $R^{35}$, $R^{36}$ and $R^{37}$ is a straight or branched alkylene group of 1 to 18 carbon atoms, preferably 1 to 10 carbon atoms, when they form a ring.

Of the acid labile groups of formula (6), straight or branched ones are exemplified by the following groups.

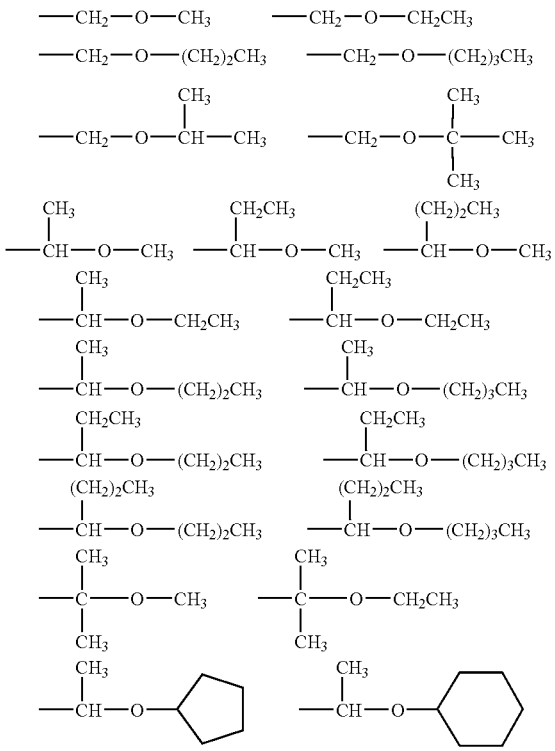

Of the acid labile groups of formula (6), cyclic ones are exemplified by tetrahydrofuran-2-yl, 2-methyltetrahydrofuran-2-yl, tetrahydropyran-2-yl, and 2-methyltetrahydropyran-2-yl.

Of the groups of formula (6), ethoxyethyl, butoxyethyl and ethoxypropyl are preferred.

In formula (7), $R^{38}$, $R^{39}$ and $R^{40}$ each are a monovalent hydrocarbon group, typically a straight, branched or cyclic alkyl group of 1 to 20 carbon atoms, which may contain a hetero atom such as oxygen, sulfur, nitrogen or fluorine. A pair of $R^{38}$ and $R^{39}$, $R^{38}$ and $R^{40}$, and $R^{39}$ and $R^{40}$, taken together, may form a ring with the carbon atom to which they are bonded.

Examples of the tertiary alkyl group represented by formula (7) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, tert-amyl, 1,1,1,3,3,3-hexafluoro-2-methyl-isopropyl, and 1,1,1,3,3,3-hexafluoro-2-cyclohexyl-isopropyl as well as the groups shown below.

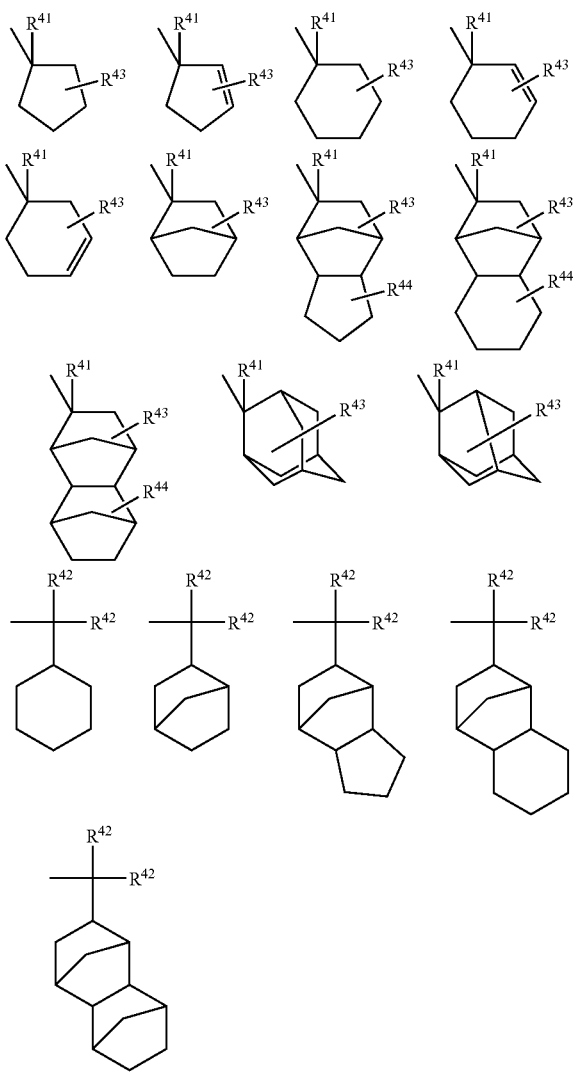

Herein, $R^{41}$ is a straight, branched or cyclic alkyl group of 1 to 6 carbon atoms, such as methyl, ethyl, propyl, isopropyl, n-butyl, sec-butyl, n-pentyl, n-hexyl, cyclopropyl, cyclopropylmethyl, cyclobutyl, cyclopentyl and cyclohexyl. $R^{42}$ is a straight, branched or cyclic alkyl group of 2 to 6 carbon atoms, such as ethyl, propyl, isopropyl, n-butyl, sec-butyl, n-pentyl, n-hexyl, cyclopropyl, cyclopropylmethyl, cyclobutyl, cyclopentyl and cyclohexyl. Each of $R^{43}$ and $R^{44}$ is hydrogen, a monovalent hydrocarbon group of 1 to 6 carbon atoms which may contain a hetero atom, or a monovalent hydrocarbon group of 1 to 6 carbon atoms which may be separated by a hetero atom. These groups may be straight, branched or cyclic. The hetero atom is typically selected from oxygen, sulfur and nitrogen atoms and may be contained or intervene in the form of —OH, —OR$^{45}$, —O—, —S—, —S(=O)—, —NH$_2$, —NHR$^{45}$, —N(R$^{45}$)$_2$, —NH— or —NR$^{45}$— wherein $R^{45}$ is a $C_{1-5}$ alkyl group. Examples of $R^{43}$ and $R^{44}$ groups include methyl, hydroxymethyl, ethyl, hydroxyethyl, propyl, isopropyl, n-butyl, sec-butyl, n-pentyl, n-hexyl, methoxy, methoxymethoxy, ethoxy and tert-butoxy.

Next, the adhesive group represented by $R^{23}$ is selected from a variety of such groups, preferably from among the groups of the following formulae.

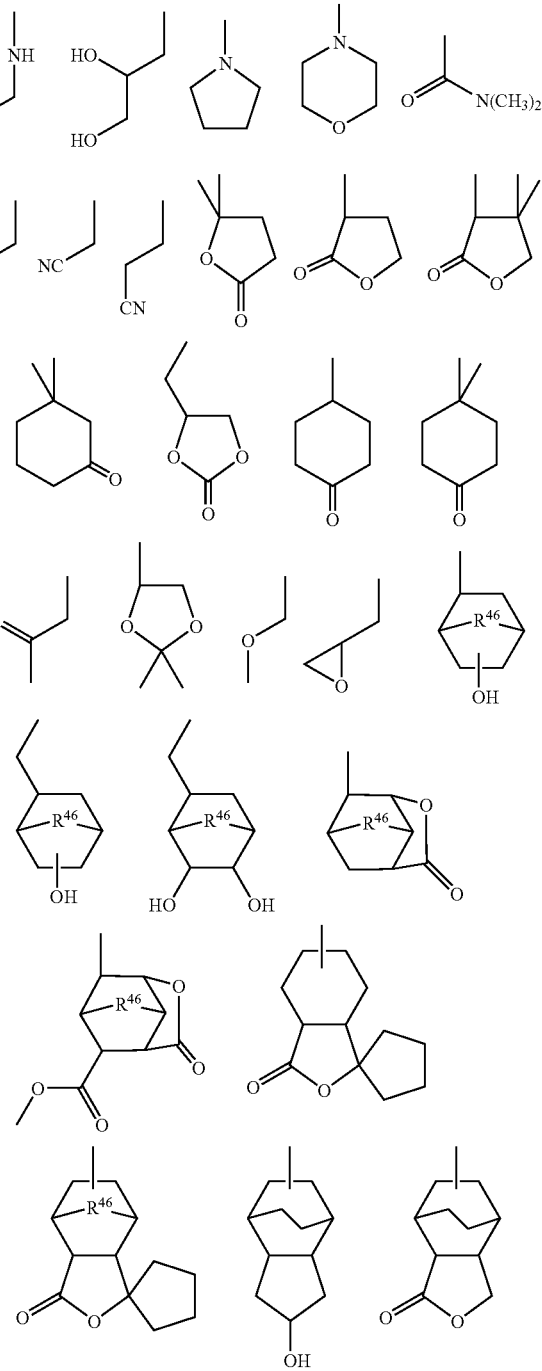

-continued

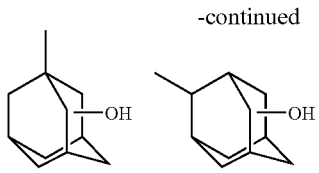

Herein, $R^{46}$ is a methylene group, oxygen atom, sulfur atom or $SO_2$.

Illustrative examples of the recurring units of formulae (1), (2a) and (2b) are given below, though not limited thereto.

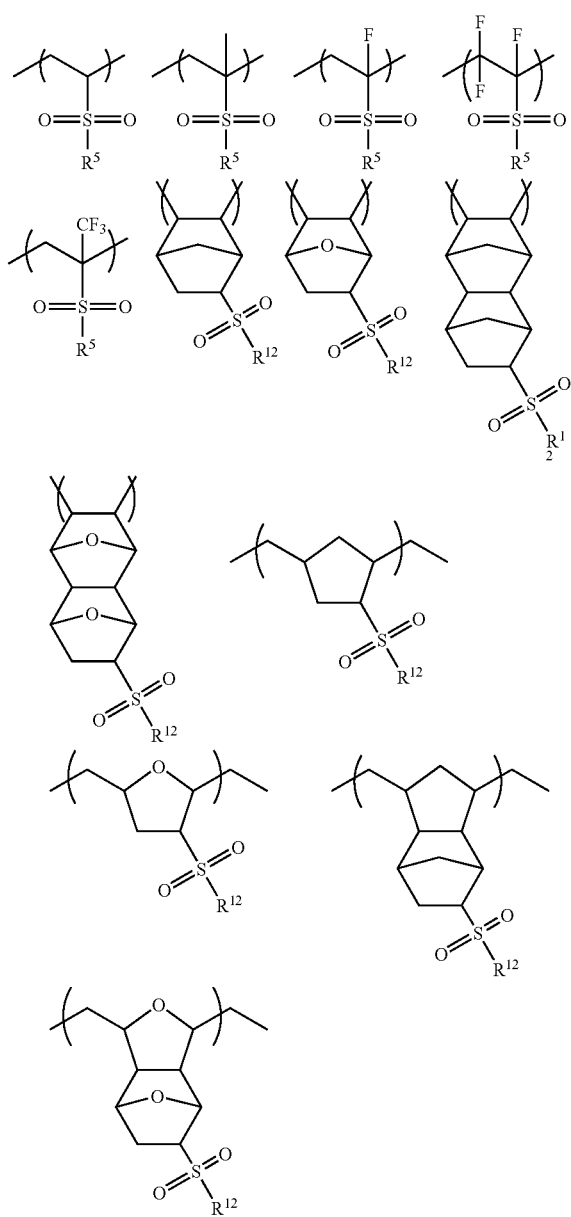

Herein, $R^5$ and $R^{12}$ are as defined above.

Illustrative examples of the substituent group of formula (3) are given below, though not limited thereto.

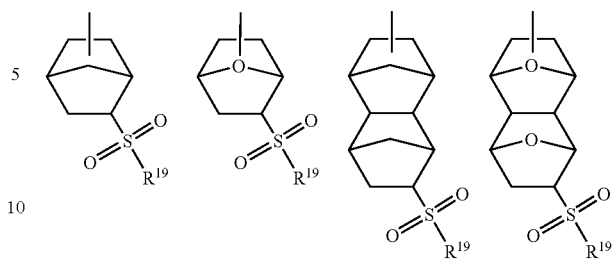

Herein, $R^{19}$ is as defined above.

In addition to the foregoing units, adhesive units as shown below may be incorporated in the inventive polymers for the purpose of improving substrate adhesion.

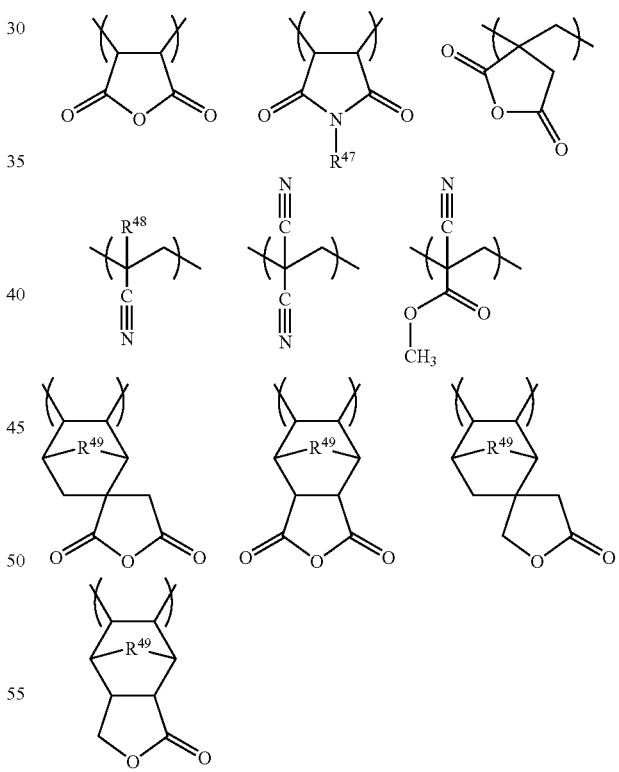

Herein, $R^{47}$ and $R^{48}$ each are hydrogen, fluorine or a straight, branched or cyclic alkyl or fluorinated alkyl group of 1 to 20 carbon atoms, and $R^{49}$ is a methylene group, oxygen atom, sulfur atom or $SO_2$.

The polymers of the invention are generally synthesized by dissolving monomers corresponding to the respective units of formulae (1), (2a), (2b), (4-1) to (4-5) and optionally, an adhesion-improving monomer and the like in a solvent, adding a catalyst thereto, and effecting polymerization reaction while heating or cooling the system if necessary. The polymerization reaction depends on the type of initiator or catalyst, trigger means (including light, heat, radiation and plasma), and polymerization conditions (including temperature, pressure, concentration, solvent, and additives). Commonly used for preparation of the polymers of the invention are radical polymerization of triggering polymerization with initiators such as 2,2'-azobisisobutyronitrile (AIBN) or the like, and ion (anion) polymerization using catalysts such as alkyl lithium. These polymerization steps may be carried out in their conventional manner.

The radical polymerization initiator used herein is not critical. Exemplary initiators include azo compounds such as AIBN, 2,2'-azobis(4-methoxy-2,4-dimethyl-valeronitrile), 2,2'-azobis(2,4-dimethylvaleronitrile), and 2,2'-azobis(2,4,4-trimethylpentane); peroxide compounds such as tert-butyl peroxypivalate, lauroyl peroxide, benzoyl peroxide and tert-butyl peroxylaurate; water-soluble initiators, for example, persulfate salts such as potassium persulfate; and redox combinations of potassium persulfate or peroxides such as hydrogen peroxide with reducing agents such as sodium sulfite. The amount of the polymerization initiator used is determined as appropriate in accordance with such factors as the identity of initiator and polymerization conditions, although the amount is often in the range of about 0.001 to 5% by weight, especially about 0.01 to 2% by weight based on the total weight of monomers to be polymerized.

For the polymerization reaction, a solvent may be used. The polymerization solvent used herein is preferably one which does not interfere with the polymerization reaction. Typical solvents include ester solvents such as ethyl acetate and n-butyl acetate, ketone solvents such as acetone, methyl ethyl ketone and methyl isobutyl ketone, aliphatic or aromatic hydrocarbon solvents such as toluene, xylene and cyclohexane, alcohol solvents such as isopropyl alcohol and ethylene glycol monomethyl ether, and ether solvents such as diethyl ether, dioxane, and tetrahydrofuran. These solvents may be used alone or in admixture of two or more. Further, any of well-known molecular weight modifiers such as dodecylmercaptan may be used in the polymerization system.

The temperature of polymerization reaction varies in accordance with the identity of polymerization initiator and the boiling point of the solvent although it is often preferably in the range of about 20 to 200° C., and especially about 50 to 140° C. Any desired reactor or vessel may be used for the polymerization reaction.

From the solution or dispersion of the polymer thus obtained, the organic solvent or water serving as the reaction medium is removed by any of well-known techniques. Suitable techniques include, for example, re-precipitation followed by filtration, and heat distillation under vacuum.

Desirably the polymer has a weight average molecular weight of about 1,000 to about 500,000, and especially about 2,000 to about 100,000.

The inventive polymer can be represented by the formula:

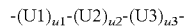

wherein U1 represents units of formula (1), (2a) or (2b) or units having substituent groups of formula (3), U2 represents units of formula (4-1) to (4-5), and U3 represents adhesive and other units. Provided u1+u2+u3=u, u1, u2 and u3 preferably fall in the range:

$0 < u1/u \leq 0.5$, more preferably $0.1 \leq u1/u \leq 0.3$, $0 < u2/u \leq 0.9$, more preferably $0.2 \leq u2/u \leq 0.8$, and $0 \leq u3/u \leq 0.7$, more preferably $0 \leq u3/u \leq 0.5$.

The polymer of the invention can be used as a base resin in resist compositions, specifically chemical amplification type resist compositions, and especially chemical amplification type positive working resist compositions. It is understood that the polymer of the invention may be admixed with another polymer for the purpose of altering the dynamic properties, thermal properties, alkali solubility and other physical properties of polymer film. The type of the other polymer which can be admixed is not critical. Any of polymers known to be useful in resist use may be admixed in any desired proportion.

Resist Composition

As long as the polymer of the invention is used as a base resin, the resist composition of the invention may be prepared using well-known components. In a preferred embodiment, the chemically amplified positive resist composition is defined as comprising (A) the above-defined polymer as a base resin, (B) an organic solvent, and (C) a photoacid generator. In the resist composition, there may be further formulated (D) a basic compound and/or (E) a dissolution inhibitor.

Component (B)

The organic solvent used as component (B) in the invention may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone.

These solvents may be used alone or in combinations of two or more thereof. Of the above organic solvents, preferred are diethylene glycol dimethyl ether and 1-ethoxy-2-propanol, in which the photoacid generator is most soluble, and propylene glycol monomethyl ether acetate which is safe, and mixtures thereof.

The solvent is preferably used in an amount of about 300 to 10,000 parts by weight, more preferably about 500 to 5,000 parts by weight per 100 parts by weight of the base resin.

Component (C)

The photoacid generator is a compound capable of generating an acid upon exposure to high energy radiation or electron beams and includes the following:

(i) onium salts of the formula (P1a-1), (P1a-2) or (P1b), (ii) diazomethane derivatives of the formula (P2), (iii) glyoxime derivatives of the formula (P3), (iv) bissulfone derivatives of the formula (P4), (v) sulfonic acid esters of N-hydroxyimide compounds of the formula (P5), (vi) β-ketosulfonic acid derivatives, (vii) disulfone derivatives, (viii) nitrobenzylsulfonate derivatives, and (ix) sulfonate derivatives.

These photoacid generators are described in detail.

(i) Onium salts of formula (P1a-1), (P1a-2) or (P1b):

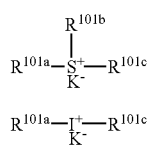
(P1a-1)

(P1a-2)

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a non-nucleophilic counter ion.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzene-sulfonate, and alkylsulfonate ions such as mesylate and butanesulfonate.

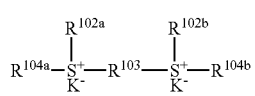
(P1b)

Herein, $R^{102a}$ and $R^{102b}$ independently represent straight, branched or cyclic alkyl groups of 1 to 8 carbon atoms. $R^{103}$ represents a straight, branched or cyclic alkylene groups of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1) and (P1a-2).

(ii) Diazomethane derivatives of formula (P2)

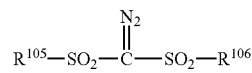
(P2)

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime derivatives of formula (P3)

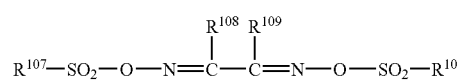
(P3)

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone derivatives of formula (P4)

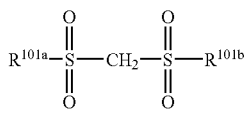

Herein, $R^{101a}$ and $R^{101b}$ are as defined above.

(v) Sulfonic acid esters of N-hydroxyimide compounds of formula (P5)

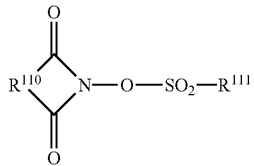

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the photoacid generator include: onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;

β-ketosulfone derivatives such as 2-cyclohexylcarbonyl-2-(p-toluenesulfonyl)propane and 2-isopropylcarbonyl-2-(p-toluenesulfonyl)propane;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and sulfonic acid esters of N-hydroxyimides such as N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5-norbornene-2,3-dicarboxyimide trifluoromethanesulfonate, and N-hydroxy-5-norbornene-2,3-dicarboxyimide p-toluenesulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonylmethyltetrahydrothiophenium triflate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; glyoxime derivatives such as bis-O-(p-toluenesulfonyl)-α-dimethylglyoxime and bis-O-(n-butanesulfonyl)-α-dimethylglyoxime; bissulfone derivatives such as bisnaphthylsulfonylmethane; and sulfonic acid esters of N-hydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is added in an amount of 0.1 to 50 parts, and especially 0.5 to 40 parts by weight, per 100 parts by weight of the base resin (all parts are by weight, hereinafter). Less than 0.1 part of the photoacid generator may generate a less amount of acid upon exposure, sometimes leading to a poor sensitivity and resolution whereas more than 50 parts of the photoacid generator may adversely affect transparency and resolution.

Component (D)

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene. Examples of suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of suitable sulfonyl group-bearing nitrogenous compounds include 3-pyridinesulfonic acid and pyridinium p-toluenesulfonate.

Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidinol,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

(B)-1

In the formulas, n is 1, 2 or 3. The side chain X may be the same or different and is represented by the formula (X)-1, (X)-2 or (X)-3. The side chain Y may be the same or different and stands for hydrogen or a straight, branched or cyclic alkyl group of 1 to 20 carbon atoms which may contain an ether or hydroxyl group. Two or three X's may bond together to form a ring.

(X)-1

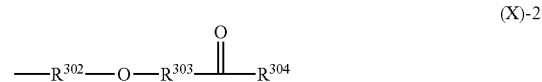
(X)-2

(X)-3

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl group, ether, ester or lactone ring; and $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl group, ether, ester or lactone ring.

Illustrative, non-limiting examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-

(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxy-butoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more of cyclic structure-bearing basic compounds having the following general formula (B)-2.

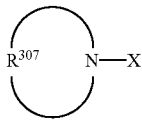

(B)-2

Herein X is as defined above, and $R^{307}$ is a straight or branched alkylene group of 2 to 20 carbon atoms which may contain one or more carbonyl, ether, ester or sulfide groups.

Illustrative examples of the cyclic structure-bearing basic compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-bearing basic compounds having the following general formulae (B)-3 to (B)-6 may be blended.

(B)-3

(B)-4

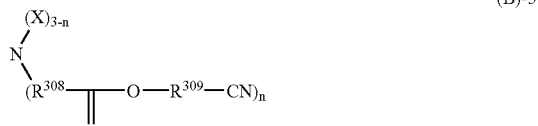

(B)-5

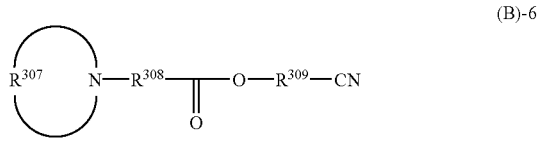

(B)-6

Herein, X, $R^{307}$ and n are as defined above, and $R^{308}$ and $R^{309}$ each are independently a straight or branched alkylene group of 1 to 4 carbon atoms.

Illustrative examples of the cyano-bearing basic compounds include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2- cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

These basic compounds may be used alone or in admixture of any. The basic compound is preferably formulated in an amount of 0.001 to 2 parts, and especially 0.01 to 1 part by weight, per 100 parts by weight of the base resin. Less than 0.001 part of the basic compound may fail to achieve the desired effects thereof, while the use of more than 2 parts would result in too low a sensitivity.

Component (E)

The dissolution inhibitor (E) is preferably selected from compounds possessing a weight average molecular weight of 100 to 1,000 and having on the molecule at least two phenolic hydroxyl groups, in which an average of from 10 to 100 mol % of all the hydrogen atoms on the phenolic hydroxyl groups are replaced with acid labile groups.

Illustrative, non-limiting, examples of the dissolution inhibitor (E) which are useful herein include bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2"-tetrahydropyranyloxy))phenyl)propane, 2,2-bis(4'-(2"-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2"-tetrahydropyranyloxy)phenyl)ethane, 1,1,2-tris(4'-(2"-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, and 1,1,2-tris(4'-(1'-ethoxypropyloxy)phenyl)ethane.

The compounds serving as dissolution inhibitor have a weight average molecular weight of 100 to 1,000, preferably 150 to 800. An appropriate amount of the dissolution inhibitor (E) is 0 to about 50 parts, preferably about 5 to 50 parts, and especially about 10 to 30 parts by weight per 100 parts by weight of the base resin. Less amounts of the dissolution inhibitor may fail to yield an improved resolution, whereas too much amounts would lead to slimming of the patterned film, and thus a decline in resolution. The inhibitor may be used singly or as a mixture of two or more thereof.

The resist composition of the invention may include optional ingredients, typically a surfactant which is commonly used for improving the coating characteristics. Optional ingredients may be added in conventional amounts so long as this does not compromise the objects of the invention.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dai-Nippon Ink & Chemicals, Inc.), Florade FC430 and FC431 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC430, Surflon S-381, Surfynol E1004, KH-20 and KH-30 are preferred. These surfactants may be used alone or in admixture.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation such as deep-UV rays, excimer laser beams, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate.

Of the various types of high-energy radiation that may be used, the resist composition of the invention is best suited to micro-pattern formation with, in particular, deep-UV rays having a wavelength of 254 to 120 nm, an excimer laser, especially ArF excimer laser (193 nm), $F_2$ excimer laser (157 nm), $Kr_2$ excimer laser (146 nm), KrAr excimer laser (134 nm) or $Ar_2$ excimer laser (126 nm), x-rays, or an electron beam. Recommended is exposure to high-energy radiation in a wavelength band of 100 to 180 nm or 1 to 30 nm, specifically $F_2$ laser beam, $Ar_2$ laser beam or soft x-ray. The desired pattern may not be obtainable outside the upper and lower limits of the above range.

The resist composition of the invention is sensitive to high-energy radiation and exhibits a high sensitivity at a wavelength of up to 300 nm, especially up to 200 nm. Due to the use of a copolymer of a sulfone or sulfonate-containing monomer as a base resin, the resist composition is improved in transparency, adhesion and developer penetration as well as plasma etching resistance. These features, combined with the reduced absorption at the exposure wavelength of an ArF laser, permit the inventive resist composition to easily form a finely defined pattern having sidewalls perpendicular to the substrate, making the resist ideal as a micropatterning material in VLSI fabrication.

EXAMPLE

Examples of the invention are given below by way of illustration and not by way of limitation. The abbreviations used herein are AIBN for 2,2'-azobisisobutyronitrile, GPC for gel permeation chromatography, NMR for nuclear magnetic resonance, Mw for weight average molecular weight, and Mn for number average molecular weight. Mw/Mn is a molecular weight distribution or dispersity.

Synthesis Example 1

Copolymerization of Monomer 1, Monomer 2 and Monomer 3 (30:40:30)

A 500-ml flask was charged with 6.23 g of Monomer 1, 7.65 g of Monomer 2, and 6.12 g of Monomer 3, all shown below, which were dissolved in 60 g of toluene. The system was fully purged of oxygen, charged with 0.30 g of the initiator AIBN, and heated at 60° C. at which polymerization reaction took place for 24 hours.

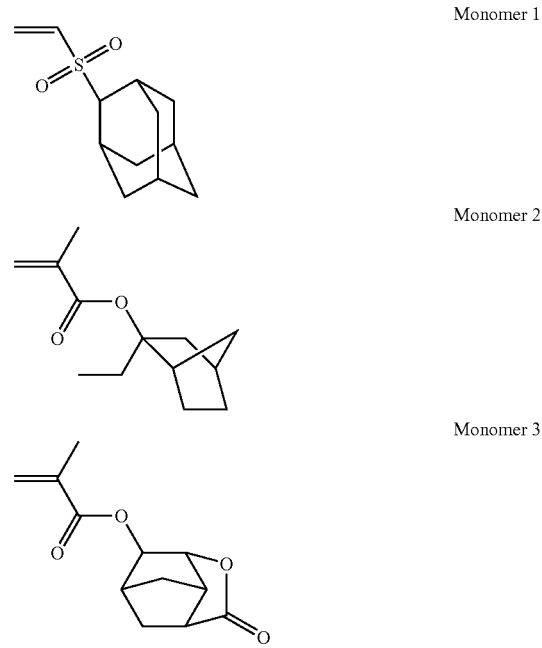

The polymer thus obtained was worked up by pouring the reaction mixture into methanol whereupon the polymer precipitated. The procedure of dissolving the polymer in tetrahydrofuran (THF) and pouring in 3 liters of methanol for precipitation was repeated twice, after which the polymer was separated and dried. There was obtained 14.9 g of a white polymer, which was found to have a Mw of 9,500 as measured by the light scattering method, and a dispersity (Mw/Mn) of 1.5 as determined from the GPC elution curve. On $^1$H-NMR analysis, the polymer was found to consist of Monomer 1/Monomer 2/Monomer 3 in a molar ratio of 29:40:31.

Synthesis Example 2

Copolymerization of Monomer 1, 2-methyl-2-adamantyl methacrylate and Monomer 3 (30:40:30)

A 500-ml flask was charged with 5.95 g of Monomer 1, 8.21 g of 2-methyl-2-adamantyl methacrylate, and 5.84 g of Monomer 3, which were dissolved in 60 g of toluene. The system was fully purged of oxygen, charged with 0.29 g of the initiator AIBN, and heated at 60° C. at which polymerization reaction took place for 24 hours.

The polymer thus obtained was worked up by pouring the reaction mixture into methanol whereupon the polymer precipitated. The procedure of dissolving the polymer in THF and pouring in 3 liters of methanol for precipitation was repeated twice, after which the polymer was separated and dried. There was obtained 15.1 g of a white polymer, which was found to have a Mw of 9,400 as measured by the light scattering method, and a dispersity (Mw/Mn) of 1.5 as determined from the GPC elution curve. On $^1$H-NMR analysis, the polymer was found to consist of Monomer 1/2-methyl-2-adamantyl methacrylate/Monomer 3 in a molar ratio of 28:39:33.

Synthesis Example 3

Copolymerization of Monomer 1, 2-ethyl-2-adamantyl methacrylate and Monomer 3 (30:40:30)

A 500-ml flask was charged with 6.91 g of Monomer 1, 7.83 g of 2-ethyl-2-adamantyl methacrylate, and 5.26 g of Monomer 3, which were dissolved in 60 g of toluene. The system was fully purged of oxygen, charged with 0.26 g of the initiator AIBN, and heated at 60° C. at which polymerization reaction took place for 24 hours.

The polymer thus obtained was worked up by pouring the reaction mixture into methanol whereupon the polymer precipitated. The procedure of dissolving the polymer in THF and pouring in 3 liters of methanol for precipitation was repeated twice, after which the polymer was separated and dried. There was obtained 15.3 g of a white polymer, which was found to have a Mw of 9,600 as measured by the light scattering method, and a dispersity (Mw/Mn) of 1.5 as determined from the GPC elution curve. On $^1$H-NMR analysis, the polymer was found to consist of Monomer 1/2-ethyl-2-adamantyl methacrylate/Monomer 3 in a molar ratio of 27:38:35.

Synthesis Example 4

Copolymerization of Monomer 4, Monomer 5 and Maleic Anhydride (10:40:50)

A 500-ml flask was charged with 3.20 g of Monomer 4, 11.42 g of Monomer 5, both shown below, and 5.38 g of maleic anhydride, which were dissolved in 6.67 g of 1,4-dioxane. The system was fully purged of oxygen, charged with 0.55 g of the initiator 2,2'-azobis(2,4-dimethylvaleronitrile), and heated at 60° C. at which polymerization reaction took place for 24 hours.

Monomer 4

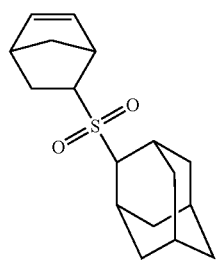

Monomer 5

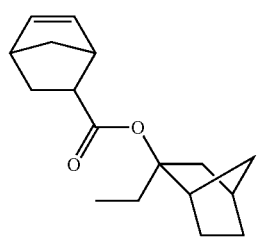

The polymer thus obtained was worked up by pouring the reaction mixture into isopropanol whereupon the polymer precipitated. The procedure of dissolving the polymer in THF and pouring in 3 liters of isopropanol for precipitation was repeated twice, after which the polymer was separated and dried. There was obtained 15.7 g of a white polymer, which was found to have a Mw of 8,100 as measured by the light scattering method, and a dispersity (Mw/Mn) of 1.5 as determined from the GPC elution curve. On $^1$H-NMR analysis, the polymer was found to consist of Monomer 4/Monomer 5/maleic anhydride in a molar ratio of 11:39:50.

Synthesis Example 5

Copolymerization of Monomer 4, Monomer 6 and Maleic Anhydride (10:40:50)

A 500-ml flask was charged with 2.95 g of Monomer 4, 12.11 g of Monomer 6, shown below, and 4.94 g of maleic anhydride, which were dissolved in 6.67 g of 1,4-dioxane. The system was fully purged of oxygen, charged with 0.50 g of the initiator 2,2'-azobis(2,4-dimethylvaleronitrile), and heated at 60° C. at which polymerization reaction took place for 24 hours.

Monomer 6

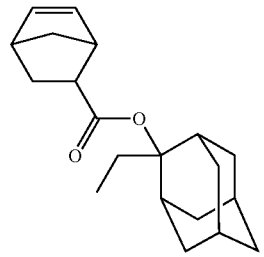

The polymer thus obtained was worked up by pouring the reaction mixture into isopropanol whereupon the polymer precipitated. The procedure of dissolving the polymer in THF and pouring in 3 liters of isopropanol for precipitation was repeated twice, after which the polymer was separated and dried. There was obtained 15.1 g of a white polymer, which was found to have a Mw of 8,300 as measured by the light scattering method, and a dispersity (Mw/Mn) of 1.5 as determined from the GPC elution curve. On $^1$H-NMR analysis, the polymer was found to consist of Monomer 4/Monomer 6/maleic anhydride in a molar ratio of 10:40:50.

Synthesis Example 6

Copolymerization of Monomer 7 and 2-methyl-2-adamantyl methacrylate (30:70)

A 500-ml flask was charged with 8.58 g of Monomer 7, shown below, and 11.42 g of 2-methyl-2-adamantyl methacrylate, which were dissolved in 80 g of toluene. The system was fully purged of oxygen, charged with 0.23 g of the initiator AIBN, and heated at 60° C. at which polymerization reaction took place for 24 hours.

Monomer 7

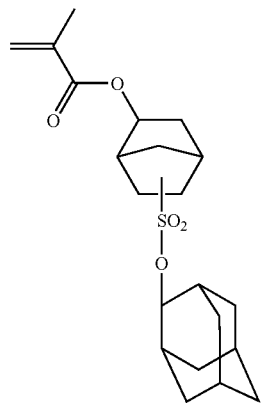

The polymer thus obtained was worked up by pouring the reaction mixture into methanol whereupon the polymer precipitated. The procedure of dissolving the polymer in THF and pouring in 3 liters of methanol for precipitation was repeated twice, after which the polymer was separated and dried. There was obtained 15.3 g of a white polymer, which was found to have a Mw of 12,000 as measured by the light scattering method, and a dispersity (Mw/Mn) of 1.5 as determined from the GPC elution curve. On $^1$H-NMR analysis, the polymer was found to consist of Monomer 7/2-methyl-2-adamantyl methacrylate in a molar ratio of 31:69.

Synthesis Example 7

Copolymerization of Monomer 7 and 2-ethyl-2-adamantyl methacrylate (30:70)

A 500-ml flask was charged with 8.29 g of Monomer 7 and 11.71 g of 2-ethyl-2-adamantyl methacrylate, which were dissolved in 80 g of toluene. The system was fully purged of oxygen, charged with 0.22 g of the initiator AIBN, and heated at 60° C. at which polymerization reaction took place for 24 hours.

The polymer thus obtained was worked up by pouring the reaction mixture into methanol whereupon the polymer precipitated. The procedure of dissolving the polymer in THF and pouring in 3 liters of methanol for precipitation was repeated twice, after which the polymer was separated and dried. There was obtained 14.0 g of a white polymer, which was found to have a Mw of 11,500 as measured by the light scattering method, and a dispersity (Mw/Mn) of 1.5 as determined from the GPC elution curve. On $^1$H-NMR analysis, the polymer was found to consist of Monomer 7/2-ethyl-2-adamantyl methacrylate in a molar ratio of 30:70.

Synthesis Example 8

Copolymerization of Monomer 8 and 2-methyl-2-adamantyl methacrylate (30:70)

A 500-ml flask was charged with 8.38 g of Monomer 8, shown below, and 11.62 g of 2-methyl-2-adamantyl methacrylate, which were dissolved in 80 g of toluene. The system was fully purged of oxygen, charged with 0.23 g of the initiator AIBN, and heated at 60° C. at which polymerization reaction took place for 24 hours.

Monomer 8

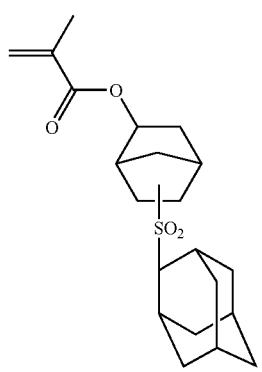

The polymer thus obtained was worked up by pouring the reaction mixture into methanol whereupon the polymer precipitated. The procedure of dissolving the polymer in THF and pouring in 3 liters of methanol for precipitation was repeated twice, after which the polymer was separated and dried. There was obtained 14.7 g of a white polymer, which was found to have a Mw of 12,500 as measured by the light scattering method, and a dispersity (Mw/Mn) of 1.5 as determined from the GPC elution curve. On $^1$H-NMR analysis, the polymer was found to consist of Monomer 8/2-methyl-2-adamantyl methacrylate in a molar ratio of 32:68.

Synthesis Example 9

Copolymerization of Monomer 8 and 2-ethyl-2-adamantyl methacrylate (30:70)

A 500-ml flask was charged with 8.1 g of Monomer 8 and 11.9 g of 2-ethyl-2-adamantyl methacrylate, which were dissolved in 80 g of toluene. The system was fully purged of oxygen, charged with 0.23 g of the initiator AIBN, and heated at 60° C. at which polymerization reaction took place for 24 hours.

The polymer thus obtained was worked up by pouring the reaction mixture into methanol whereupon the polymer precipitated. The procedure of dissolving the polymer in THF and pouring in 3 liters of methanol for precipitation was repeated twice, after which the polymer was separated and dried. There was obtained 14.7 g of a white polymer, which was found to have a Mw of 11,000 as measured by the light scattering method, and a dispersity (Mw/Mn) of 1.5 as determined from the GPC elution curve. On $^1$H-NMR analysis, the polymer was found to consist of Monomer 8/2-ethyl-2-adamantyl methacrylate in a molar ratio of 31:69.

Evaluation

Polymer Transmittance Measurement

The polymers obtained in Synthesis Examples 1 to 9, designated Polymers 1 to 9, respectively, were determined for transmittance. Three other polymers were furnished for comparison purposes. Comparative Polymer 1 is a monodisperse polyhydroxystyrene having a molecular weight of 10,000 and a dispersity (Mw/Mn) of 1.1 in which 30% of hydroxyl groups are replaced by tetrahydropyranyl groups. Similarly, Comparative Polymer 2 is polymethyl methacrylate having a molecular weight of 15,000 and a dispersity (Mw/Mn) of 1.7; and Comparative Polymer 3 is a novolac polymer having a meta/para ratio of 40/60, a molecular weight of 9,000 and a dispersity (Mw/Mn) of 2.5.

Each polymer, 5 g, was thoroughly dissolved in 20 g of propylene glycol monomethyl ether acetate (PGMEA), and passed through a 0.2-μm filter, obtaining a polymer solution. The polymer solution was spin coated onto a $MgF_2$ substrate and baked on a hot plate at 100° C. for 90 seconds, forming a polymer film of 500 nm thick on the substrate. Using a vacuum ultraviolet spectrometer (VUV-200S by Nihon Bunko Co., Ltd.), the polymer film was measured for transmittance at 248 nm and 193 nm. The results are shown in Table 1.

TABLE 1

| | Transmittance (%) | |
|---|---|---|
| Polymer | 248 nm | 193 nm |
| Polymer 1 | 90 | 78 |
| Polymer 2 | 90 | 76 |
| Polymer 3 | 91 | 75 |
| Polymer 4 | 89 | 70 |
| Polymer 5 | 90 | 70 |
| Polymer 6 | 90 | 76 |
| Polymer 7 | 90 | 74 |
| Polymer 8 | 90 | 72 |
| Polymer 9 | 90 | 76 |
| Comparative Polymer 1 | 90 | 5 |
| Comparative Polymer 2 | 91 | 80 |
| Comparative Polymer 3 | 82 | 6 |

It is evident from Table 1 that resist materials using the inventive polymers maintain sufficient transparency at the ArF excimer laser wavelength (193 nm).

Resist Preparation and Exposure

Resist solutions were prepared in a conventional manner by dissolving the polymer, photoacid generator (PAG1 or PAG2), basic compound (tributylamine or triethanolamine), and dissolution inhibitor (DRIL) in a solvent (PGMEA) in amounts as shown in Table 2 and passing through a 0.2-µm filter.

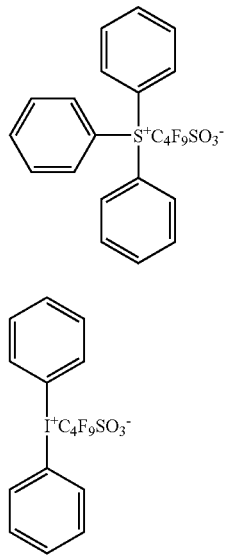

PAG1

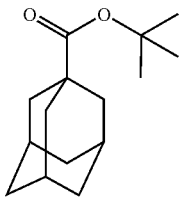

DRI1

On silicon wafers having a film of AR-19 (Shipley) coated to a thickness of 85 nm, the resist solutions were spin coated, then baked on a hot plate at 120° C. for 90 seconds to give resist films having a thickness of 300 nm.

The resist films were exposed by means of an ArF excimer laser micro-stepper (Nikon Corp., NA 0.55, σ0.7). Immediately after exposure, the resist films were baked (PEB) at 120° C. for 90 seconds and then developed for 60 seconds with a 2.38% aqueous solution of tetramethylammonium hydroxide, obtaining positive patterns.

The resist patterns were evaluated for sensitivity and resolution. The sensitivity Eth of resist was the exposure dose which provided a 1:1 resolution at the top and bottom of a 0.18-µm line-and-space pattern. The minimum line width (µm) of a line-and-space pattern which was ascertained separate at this dose was the resolution of resist. The results are shown in Table 2.

TABLE 2

| Polymer (pbw) | Photoacid generator (pbw) | Basic compound (pbw) | Dissolution inhibitor (pbw) | Solvent (pbw) | Eth, mJ/cm$^2$ | Resolution (µm) |
|---|---|---|---|---|---|---|
| Polymer 1 (100) | PAG1 (4) | tributylamine (0.1) | — | PGMEA (1000) | 15 | 0.16 |
| Polymer 2 (100) | PAG1 (4) | tributylamine (0.1) | — | PGMEA (1000) | 38 | 0.16 |
| Polymer 3 (100) | PAG1 (4) | tributylamine (0.1) | — | PGMEA (1000) | 28 | 0.16 |
| Polymer 4 (100) | PAG1 (4) | tributylamine (0.1) | — | PGMEA (1000) | 12 | 0.17 |
| Polymer 5 (100) | PAG1 (4) | tributylamine (0.1) | — | PGMEA (1000) | 18 | 0.17 |
| Polymer 6 (100) | PAG1 (2) | tributylamine (0.1) | — | PGMEA (1000) | 35 | 0.18 |
| Polymer 7 (100) | PAG1 (2) | tributylamine (0.1) | — | PGMEA (1000) | 30 | 0.18 |
| Polymer 8 (100) | PAG1 (2) | tributylamine (0.1) | — | PGMEA (1000) | 38 | 0.18 |
| Polymer 9 (100) | PAG1 (2) | tributylamine (0.1) | — | PGMEA (1000) | 29 | 0.17 |
| Polymer 3 (100) | PAG1 (4) | triethanolamine (0.1) | — | PGMEA (1000) | 30 | 0.15 |
| Polymer 3 (100) | PAG1 (4) | tributylamine (0.1) | DRI1 (10) | PGMEA (1000) | 22 | 0.17 |
| Polymer 3 (100) | PAG2 (4) | tributylamine (0.1) | — | PGMEA (1000) | 35 | 0.15 |
| Comparative Polymer 1 (100) | PAG1 (4) | triethanolamine (0.1) | — | PGMEA (1000) | pattern did not form | — |

Japanese Patent Application Nos. 2002-085547 and 2002-085598 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer comprising recurring units of the following general formula (2a) or (2b) and having a weight average molecular weight of 1,000 to 500,000,

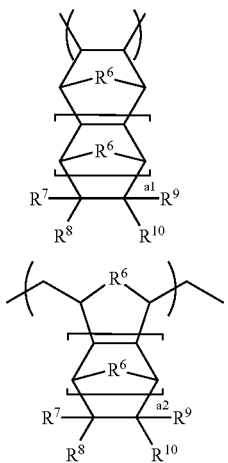

wherein $R^6$ is a methylene group, oxygen atom, sulfur atom or $SO_2$, $R^7$ to $R^{10}$ each are hydrogen, fluorine, a straight, branched or cyclic alkyl or fluorinated alkyl group of 1 to 20 carbon atoms or $-R^{11}-SO_2R^{12}$, at least one of $R^7$ to $R^{10}$ containing $-R^{11}-SO_2R^{12}$, $R^{11}$ is a valence bond or a straight, branched or cyclic alkylene or fluorinated alkylene group of 1 to 20 carbon atoms, $R^{12}$ is fluorine or a straight, branched or cyclic alkyl group of 1 to 20 carbon atoms which does not contain a hetero atom, a1 is 0 or 1, and a2 is an integer of 0 to 2.

2. A polymer comprising recurring units each having a functional group of the following general formula (3), and having a weight average molecular weight of 1,000 to 500,000,

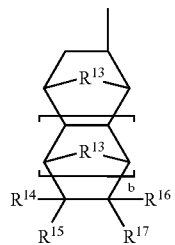

wherein $R^{13}$ is a methylene group, oxygen atom, sulfur atom or $SO_2$, $R^{14}$ to $R^{17}$ each are hydrogen, a straight, branched or cyclic alkyl group of 1 to 20 carbon atoms, $-R^{18}-SO_3R^{19}$ or $-R^{18}-SO_2R^{19}$, at least one of $R^{14}$ to $R^{17}$ containing $-R^{18}-SO_3R^{19}$ or $-R^{18}-SO_2R^{19}$, $R^{18}$ is a valence bond or a straight, branched or cyclic alkylene group of 1 to 20 carbon atoms, $R^{19}$ is hydrogen, an acid labile group, an adhesive group or a straight, branched or cyclic alkyl group of 1 to 20 carbon atoms which does not contain a hetero atom, and b is 0 or 1.

3. A resist composition comprising polymer comprising recurring units of the following general formula (1) and having a weight average molecular weight of 1,000 to 500,000,

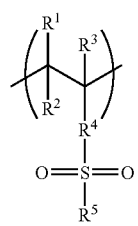

wherein $R^1$ to $R^{13}$ each are hydrogen, fluorine or a straight, branched or cyclic alkyl or fluorinated alkyl group of 1 to 20 carbon atoms, $R^4$ is a valence bond or a straight, branched or cyclic alkylene or fluorinated alkylene group of 1 to 20 carbon atoms, and $R^5$ is a straight, branched or cyclic alkyl group of 1 to 20 carbon atoms which does not contain a hetero atom.

4. A chemically amplified positive resist composition comprising
(A) a polymer comprising recurring units of the following general formula (1) and having a weight average molecular weight of 1,000 to 500,000,

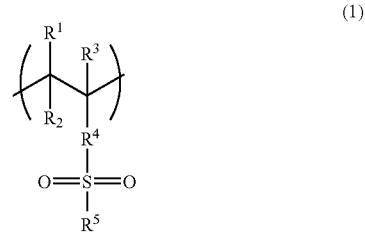

wherein $R^1$ to $R^3$ each are hydrogen, fluorine or a straight, branched or cyclic alkyl or fluorinated alkyl group of 1 to 20 carbon atoms, $R^4$ is a valence bond or a straight, branched or cyclic alkylene or fluorinated alkylene group of 1 to 20 carbon atoms, and $R^5$ is a straight, branched or cyclic alkyl group of 1 to 20 carbon atoms which does not contain a hetero atom,
(B) an organic solvent, and
(C) a photoacid generator.

5. The resist composition of claim 4, further comprising (D) a basic compound.

6. The resist composition of claim 4, further comprising (E) a dissolution inhibitor.

7. A process for forming a resist pattern comprising the steps of:
applying the resist composition of claim 3 onto a substrate to form a coating,
heat treating the coating and then exposing it to high-energy radiation in a wavelength band of 100 to 300 nm or 1 to 30 nm through a photomask, and
optionally heat treating the exposed coating and developing it with a developer.

8. The pattern forming process of claim 7 wherein the high-energy radiation is a KrF, ArF, F$_2$ or Ar$_2$ laser beam or soft x-ray.

9. A resist composition comprising a polymer comprising recurring units of the following general formula (2a) or (2b) and having a weight average molecular weight of 1,000 to 500,000,

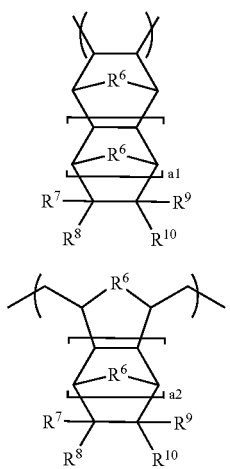

(2a)

(2b)

wherein R$^6$ is a methylene group, oxygen atom, sulfur atom or SO$_2$, R$^7$ to R$^{10}$ each are hydrogen, fluorine, a straight, branched or cyclic alkyl or fluorinated alkyl group of 1 to 20 carbon atoms or —R$^{11}$—SO$_2$R$_2$, at least one of R$^7$ to R$^{10}$ containing —R$^{11}$—SO$_2$R$^{12}$, R$^{11}$ is a valence bond or a straight, branched or cyclic alkylene or fluorinated alkylene group of 1 to 20 carbon atoms, R$^{12}$ is fluorine or a straight, branched or cyclic alkyl group of 1 to 20 carbon atoms which does not contain a hetero atom, a1 is 0 or 1, and a2 is an integer of 0 to 2.

10. A chemically amplified positive resist composition comprising:
(A) a polymer comprising recurring units of the following general formula (2a) or (2b) and having a weight average molecular weight of 1,000 to 500,000,

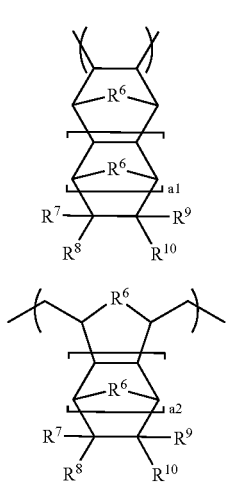

(2a)

(2b)

wherein R$^6$ is a methylene group, oxygen atom, sulfur atom or SO$_2$, R$^7$ to R$^{10}$ each are hydrogen, fluorine, a straight, branched or cyclic alkyl or fluorinated alkyl group of 1 to 20 carbon atoms or —R$^{11}$13 SO$_2$R$^{12}$, at least one of R$^7$ to R$^{10}$ containing —R$^{11}$—SO$_2$R$^{12}$, R$^{11}$ is a valence bond or a straight, branched or cyclic alkylene or fluorinated alkylene group of 1 to 20 carbon atoms, R$^{12}$ is fluorine or a straight, branched or cyclic alkyl group of 1 to 20 carbon atoms which does not contain a hetero atom, a1 is 0 or 1, and a2 is an integer of 0 to 2,
(B) an organic solvent, and
(C) a photoacid generator.

11. A resist composition comprising a polymer comprising recurring units each having a functional group of the following general formula (3), and having a weight average molecular weight of 1,000 to 500,000,

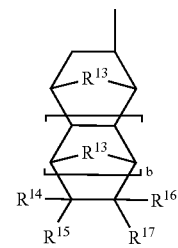

(3)

wherein R$^{13}$ is a methylene group, oxygen atom, sulfur atom or SO$_2$, R$^{14}$ to R$^{17}$ each are hydrogen, a straight, branched or cyclic alkyl group of 1 to 20 carbon atoms, —R$^{18}$—SO$_3$R$^{19}$ or —R$^{18}$—SO$_2$R$^{19}$, at least one of R$^{14}$ to R$^{17}$ containing —R$^{18}$—SO$_3$R$^{19}$ or —R$^{18}$—SO$_2$R$^{19}$, R$^{18}$ is a valence bond or a straight, branched or cyclic alkylene group of 1 to 20 carbon atoms, R$^{19}$ is hydrogen, an acid labile group, an adhesive group or a straight, branched or cyclic alkyl group of 1 to 20 carbon atoms which does not contain a hetero atom, and b is 0 or 1.

12. A chemically amplified positive resist composition comprising:
(A) a resist composition comprising a polymer comprising recurring units each having a functional group of the following general formula (3), and having a weight average molecular weight of 1,000 to 500,000, (3)

wherein R$^{13}$ is a methylene group, oxygen atom, sulfur atom or SO$_2$, R$^{14}$ to R$^{17}$ each are hydrogen, a straight, branched or cyclic alkyl group of 1 to 20 carbon atoms, —R$^{18}$—SO$_3$R$^{19}$ or —R$^{18}$—SO$_2$R$^{19}$, at least one of R$^{14}$ to R$^{17}$ containing —R$^{18}$—SO$_3$R$^{19}$ or —R$^{18}$—SO$_2$R$^{19}$, R$^{18}$ is a valence bond or a straight, branched or cyclic alkylene group of 1 to 20 carbon atoms, R$^{19}$ is hydrogen, an acid labile group, an adhesive group or a straight, branched or cyclic alkyl group of 1 to 20 carbon atoms which does not contain a hetero atom, and b is 0 or 1, (B) an organic solvent, and (C) a photoacid generator.

13. A polymer comprising recurring units of the following general formula (1) and having a weight average molecular weight of 1,000 to 500,000,

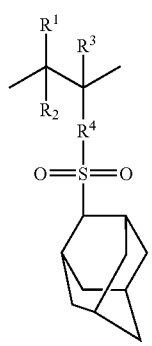
(1)

wherein $R^1$ to $R^3$ each are hydrogen, fluorine or a straight, branched or cyclic alkyl or fluorinated alkyl group of 1 to 20 carbon atoms, $R^4$ is a valence bond or a straight, branched or cyclic alkylene or fluorinated alkylene group of 1 to 20 carbon atoms.

14. A polymer comprising recurring units of the following general formula (1) and recurring units of any one of the following general formulae (4-1) to (4-5), and having a weight average molecular weight of 1,000 to 500,000,

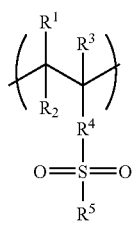
(1)

wherein $R^1$ to $R^3$ each are hydrogen, fluorine or a straight, branched or cyclic alkyl or fluorinated alkyl group or 1 to 20 carbon atoms, $R^4$ is a valence bond or a straight, branched or cyclic alkylene or fluorinated alkylene group of 1 to 20 carbon atoms, and $R^5$ is a straight, branched or cyclic alkyl group of 7 to 20 carbon atoms which does not contain a hetero atom,

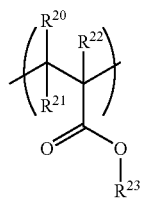
(4-1)

-continued

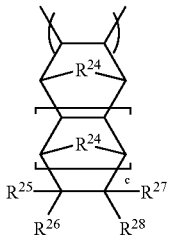
(4-2)

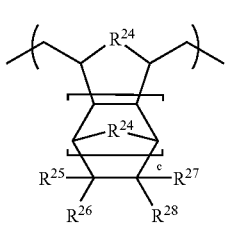
(4-3)

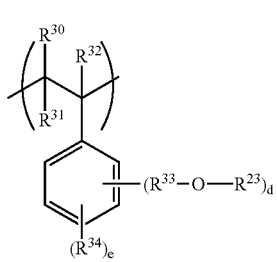
(4-4)

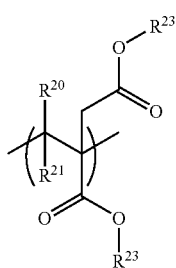
(4-5)

wherein $R^{20}$ to $R^{22}$ and $R^{30}$ to $R^{32}$ each are hydrogen, fluorine or a straight, branched or cyclic alkyl or fluorinated alkyl group of 1 to 20 carbon atoms, $R^{23}$ is a group of the formula (3) below, an acid labile group, an adhesive group, or a straight, branched or cyclic fluorinated alkyl group of 1 to 20 carbon atoms,

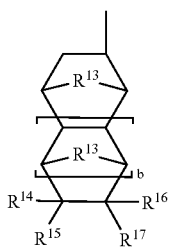
(3)

wherein $R^{13}$ is a methylene group, oxygen atom, sulfur atom or $SO_2$, $R^4$ to $R^{17}$ each are hydrogen, a straight, branched or cyclic alkyl group of 1 to 20 carbon atoms, $-R^{18}-SO_3R^{19}$ or $-R^{18}-SO_2R^{19}$, at least one of $R^{14}$ to $R^{17}$ containing $-R^{18}-SO_3R^{19}$ or $-R^{18}-SO_2R^{19}$, $R^{18}$ is a valence bond or a straight, branched or cyclic alkylene group of 1 to 20 carbon atoms, $R^9$ is hydrogen, an acid labile group, an adhesive group or a straight, branched or cyclic alkyl group of 1 to 20 carbon atoms which does not contain a hetero atom and b is 0 or 1, said adhesive group being selected from the group consisting of the group of the following formulae:

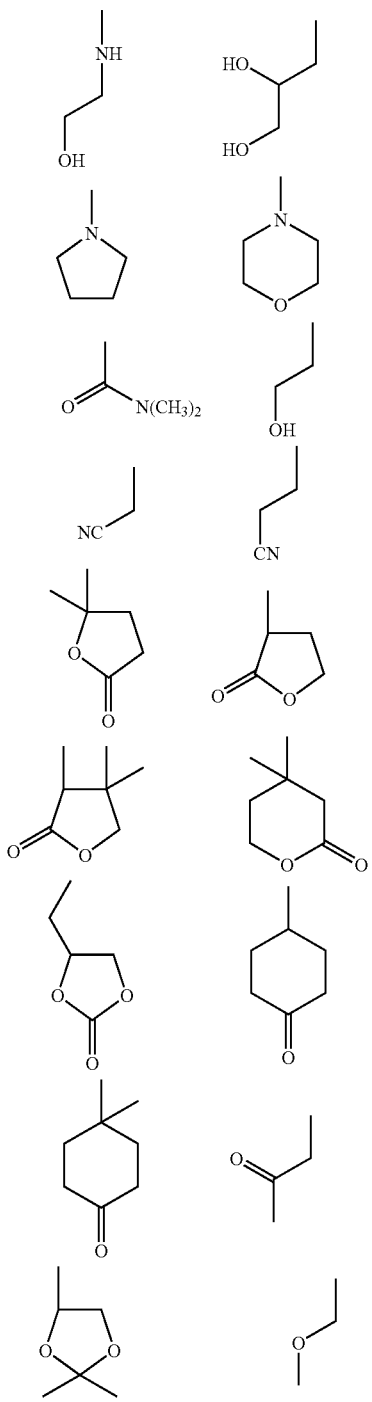

-continued

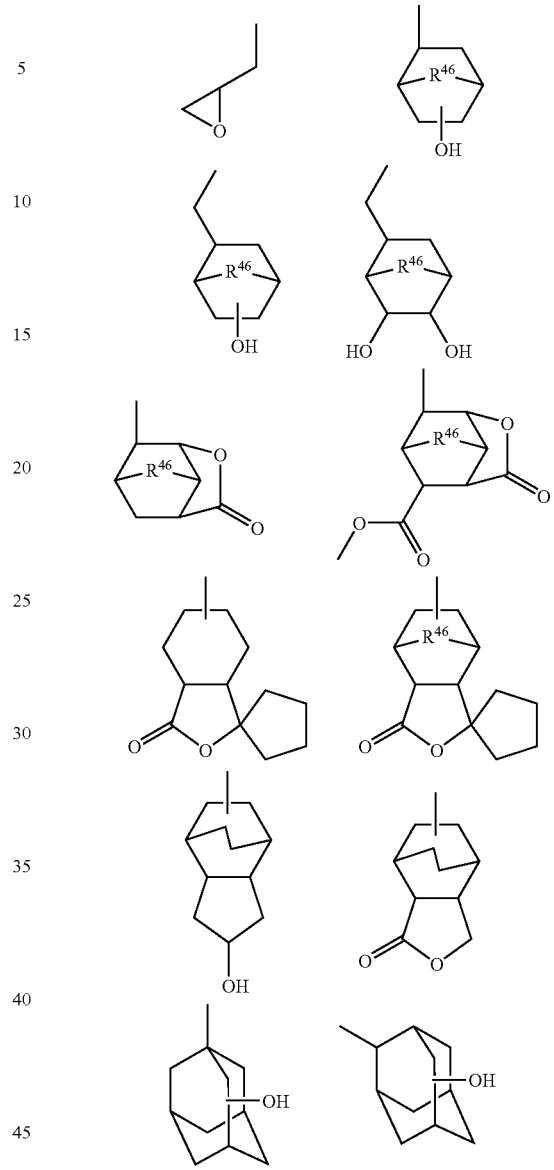

$R^{24}$ is a methylene group, oxygen atom, sulfur atom or $SO_2$, $R^{25}$ to $R^{28}$ each are hydrogen, fluorine, $-R^{29}-OR^{23}$, $-R^{29}-CO_2R^{23}$ or a straight, branched or cyclic alkyl or fluorinated alkyl group of 1 to 20 carbon atoms, $R^{29}$ and $R^{33}$ each are a valence bond or a straight, branched or cyclic alkylene or fluorinated alkylene group of 1 to 20 carbon atoms, $R^{34}$ is a straight, branched or cyclic fluorinated alkyl group of 1 to 20 carbon atoms, $R^{46}$ is a methylene group, oxygen atom, sulfur atom or $SO_2$, c is 0 or 1, d is 1 or 2, e is an integer of 0 to 4, and $1 \leq d+e \leq 5$.

* * * * *